United States Patent
Jia

(10) Patent No.: US 8,258,730 B2
(45) Date of Patent: Sep. 4, 2012

(54) MOTOR DRIVING CIRCUIT CAPABLE OF OUTPUTTING DUAL FREQUENCY GENERATOR (FG) SIGNAL

(75) Inventor: Xiang-You Jia, Sinjhuang (TW)

(73) Assignee: Asia Vital Components (China) Co., Ltd., Shenzhen (CN)

( * ) Notice: Subject to any disclaimer, the term of this patent is extended or adjusted under 35 U.S.C. 154(b) by 247 days.

(21) Appl. No.: 12/770,063

(22) Filed: Apr. 29, 2010

(65) Prior Publication Data
US 2011/0266983 A1    Nov. 3, 2011

(51) Int. Cl.
*H02P 6/06* (2006.01)
(52) U.S. Cl. .................. 318/400.06; 318/400.38
(58) Field of Classification Search .............. 318/400.06, 318/400.38
See application file for complete search history.

(56) References Cited

U.S. PATENT DOCUMENTS

| 5,241,267 | A | * | 8/1993 | Gleixner et al. | ........... 324/207.2 |
| 5,276,569 | A | * | 1/1994 | Even | .......... 360/73.02 |

* cited by examiner

*Primary Examiner* — Bentsu Ro
*Assistant Examiner* — Erick Glass

(57) ABSTRACT

A motor driving circuit capable of outputting a dual FG signal includes a control unit, a first Hall unit, a second Hall unit and a logic unit. The control unit is electrically connected to the first Hall unit and configured to generate a first FG signal based on a Hall signal sent by the first Hall unit. The second Hall unit is configured to detect the change in magnetic fields to generate a second FG signal to the logic unit. The logic unit is electrically connected to the control unit and the second Hall unit. The logic unit is configured to perform a logic operation based on the received first and second FG signals to convert them into a dual FG signal for an external system. With the control unit, the first Hall unit, the second Hall unit and the logic unit being integrated in the motor driving circuit, the convenience in use can be improved greatly. Furthermore, the working hours and the production cost can be reduced.

4 Claims, 4 Drawing Sheets

MOTOR DRIVING CIRCUIT CAPABLE OF OUTPUTTING DUAL FREQUENCY GENERATOR (FG) SIGNAL

BACKGROUND OF THE INVENTION

1. Field of the Invention

The present invention relates to a motor driving circuit, and in particular to a motor driving circuit capable of outputting a dual frequency generator (FG) signal, which is capable of reducing working hours and facilitating the convenience in use with more higher efficiency and less cost.

2. Description of Prior Art

In order to prevent the temperature of a system in an electronic product from becoming too high to suffer damage, a heat-dissipating fan is usually mounted in this system. With this arrangement, when the temperature of the system exceeds a threshold value, the fan will be activated to reduce the temperature of the system for heat dissipation.

The above-mentioned heat-dissipating fan is activated by a motor. Generally, a brushless DC motor (referred to as "BLDC" hereinafter) is popular in the industry because of its easy maintenance, good controllability, and excellent performance. The BLDC can be applied in a wide range from a small motor inside a hard disk driver (or an optical disk driver) to a large motor for an electric vehicle because the BLDC can has advantages of high efficiency, stable rotating speed, large torque, durability and easy maintenance.

The conventional BLDC is controlled by an internal motor driving circuit, thereby controlling the rotating speed of the motor or the like. The motor driving circuit includes a control unit and a Hall component. The Hall component detects the phase change in a motor rotor to generate a Hall signal. The Hall signal is outputted to the control unit. Then, the control unit performs a logic operation to the Hall signal, thereby generating a control signal for controlling the operation of the motor.

The control unit further has a frequency generator output terminal for outputting a frequency generator (FG) signal. The FG signal is a signal having the same frequency as that of the Hall signal. The FG output terminal is connected to an external system (such as a computer), so that the external system can monitor the rotating speed of the motor based on the received FG signal.

However, a common four-pole BLDC merely outputs a FG signal to the external system based on Formula: F=2N/60. If a dual FG signal is to be obtained, an eight-pole BLDC has to be used, thereby outputting a dual FG signal to the external system based on Formula F=4N/60 (N represents the rotating speed of the fan). As a result, it is inconvenient to output a dual FG signal in practice.

However, in practice, the mold for manufacturing a four-pole BLDC is not compatible with the mold for manufacturing an eight-pole BLDC, so that it is necessary to provide an additional mold to manufacture an eight-pole BLDC, which increases the production time and cost.

According to the above, the conventional art has disadvantages of inconvenience, increased cost and working hours.

Therefore, it is an important issue for the present inventor and the manufacturers in this filed to solve the above-mentioned problems in prior art.

SUMMARY OF THE INVENTION

In order to solve the above problems, an objective of the present invention is to provide a motor driving circuit capable of outputting a dual FG signal, in which a control unit, a first Hall unit, a second Hall unit and a logic unit are integrated. With this arrangement, the cost can be reduced and the convenience in use can be improved.

Another objective of the present invention is to provide a motor driving circuit capable of outputting a dual FG signal, which can be made with reduced working hours.

In order to achieve the above objectives, the present invention provides a motor driving circuit capable of outputting a dual FG signal, which includes: a control unit electrically connected to a first Hall unit, the control unit being configured to generate a first FG signal based on a Hall signal sent by the first Hall unit; a second Hall unit configured to detect the phase change in magnetic fields of a motor rotor to generate a second FG signal; a logic unit electrically connected to the control unit and the second Hall unit, the logic unit being configured to perform a logic operation to the received first and second FG signals, thereby converting them into a dual FG signal for an external system. With the control unit, the first Hall unit, the second Hall unit and the logic unit being integrated in the motor driving circuit, the convenience in use can be improved greatly. Furthermore, the working hours and the production cost can be reduced.

DETAILED DESCRIPTION OF THE INVENTION

Figure 1:
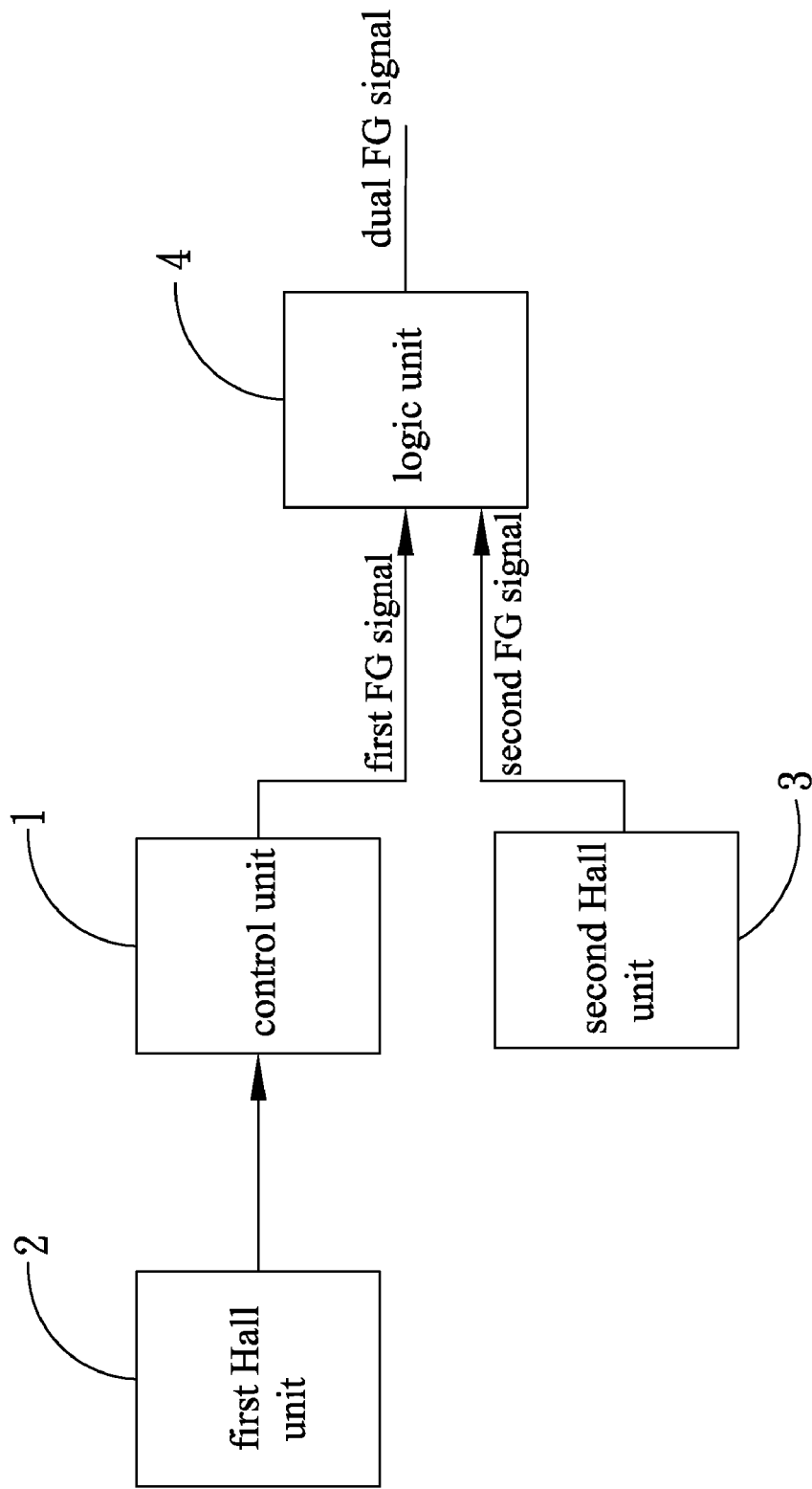
FIG. 1 is a block view showing a preferred embodiment of the present invention.

The above objectives and structural and functional features of the present invention will be described in more detail with reference to a preferred embodiment thereof shown in the accompanying drawings Please refer to FIGS. 1 and 2. The present invention provides a motor driving circuit capable of outputting a dual FG signal. In the present embodiment, the motor driving circuit includes a control unit 1, a first Hall unit 2, a second Hall unit 3 and a logic unit 4. The first Hall unit 2 is electrically connected to the control unit 1 and configured to detect the phase change in a rotor of a motor 5 to thereby generate a Hall signal. The generated Hall signal is sent to the control unit 1. Then, the control unit 1 processes the Hall signal sent by the first Hall unit 2 to generate a first frequency generator (FG) signal. The first Hall unit 2 monitors a detection period of the rotor of the motor 5 at a predetermined position to thereby generate a Hall signal. After receiving the Hall signal, the control unit 1 processes the received Hall signal to output a square wave signal (i.e. the first FG signal).

The second Hall unit 3 is provided at a position corresponding to the rotor of the motor 5 to detect the change in magnetic fields of the rotor of the motor 5, thereby generating a second FG signal. The second Hall unit 3 detects the phase change in the rotor of the motor 5 and then processes this phase change to generate another square wave signal (i.e. the second FG signal).

The logic unit 4 is electrically connected to the control unit 1 and the second Hall unit 3. The logic unit 4 receives the first FG signal and the second FG signal and performs a logic operation to them, thereby converting these two FG signals into a dual FG signal. That is, when the logic unit 4 simultaneously receives the first FG signal and the second FG signal, the first FG signal is offset from the second FG signal by one phase. Then, these two FG signals are subjected to an "XOR" operation by the logic unit 4 to generate the dual FG signal.

Furthermore, the output terminal of the logic unit 4 is connected to an external system (not shown). The external system monitors or measures the rotating speed of the motor 5 based on the dual FG signal sent by the output terminal of the logic unit 4. Alternatively, the external system can be applied to other cases.

In the present embodiment, a four-pole BLDC is used as an example. By using the motor driving circuit of the present invention, the four-pole BLDC can generate a dual FG signal. Thus, the problem of prior art that the eight-pole BLDC has to be used for generating a dual FG signal can be solved. Furthermore, the complicated steps of exchanging the four-pole BLDC and the eight-pole BLDC can be omitted, thereby increasing the convenience in use.

On the other hand, with a mold for manufacturing a four-pole BLDC and the aforesaid motor driving circuit, a dual FG signal can be outputted. In this way, the products can be standardized and the working hours and cost can be reduced.

Figure 2:
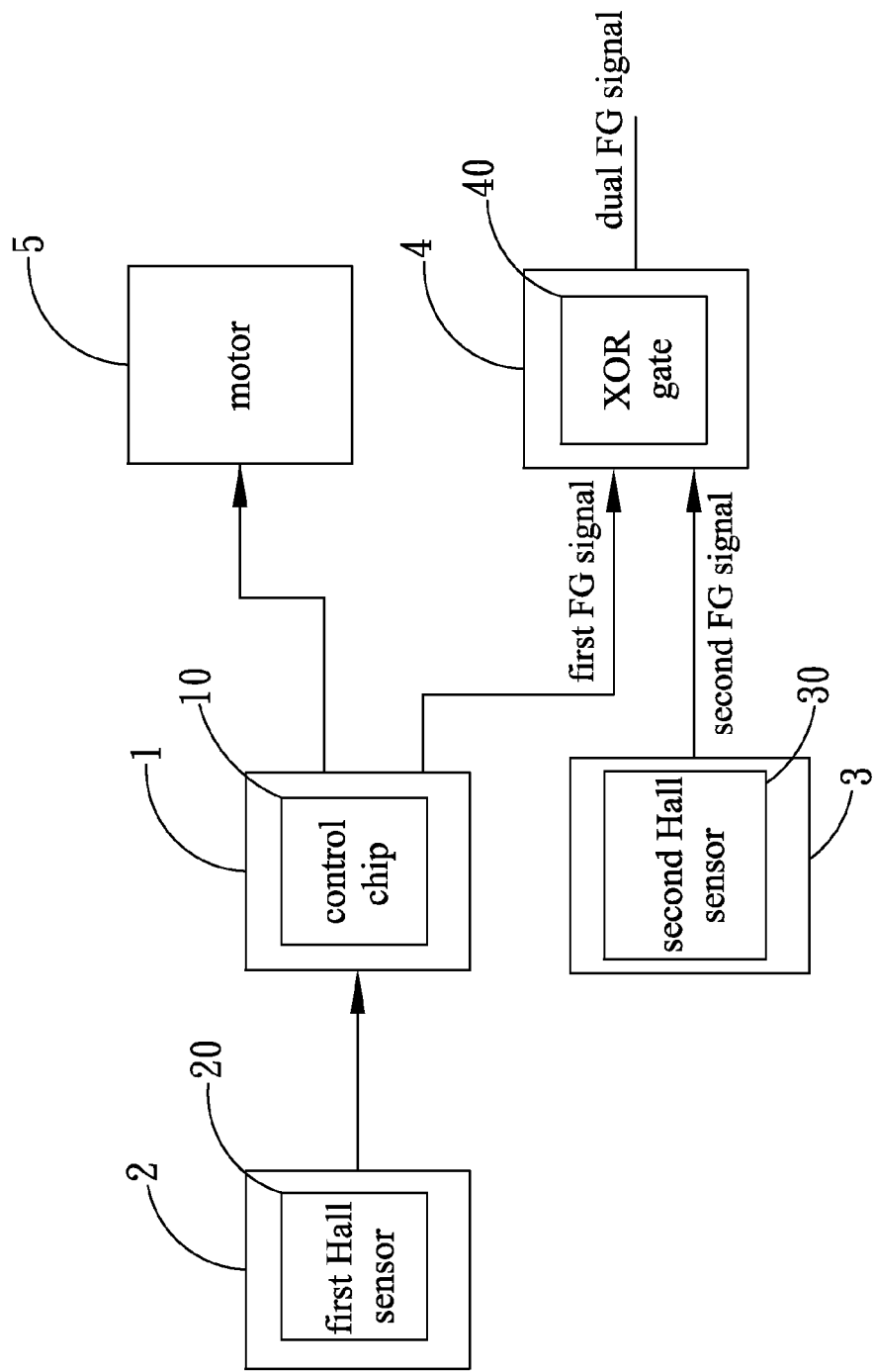
FIG. 2 is another block view showing the preferred embodiment of the present invention.
Figure 3:
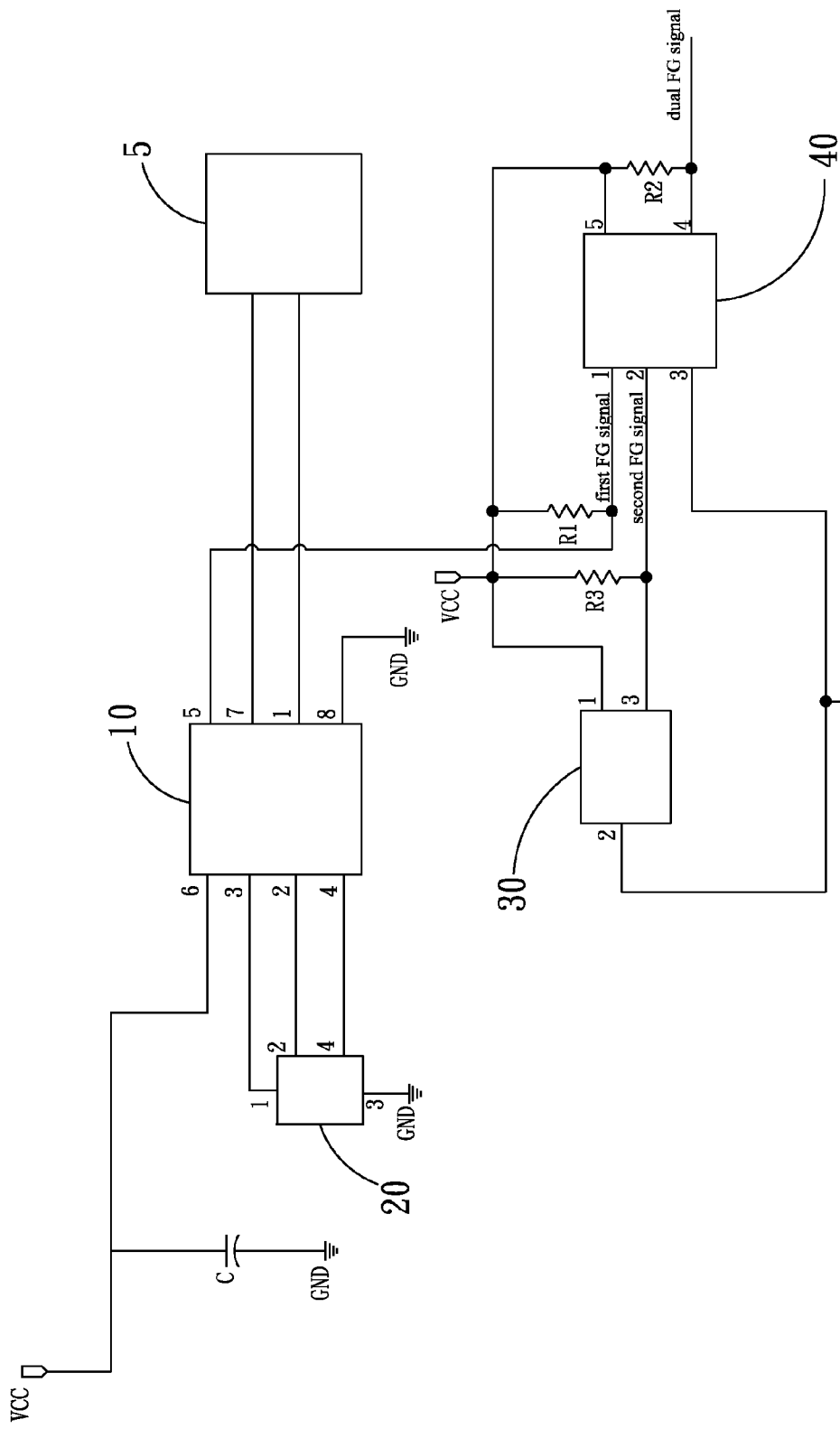
FIG. 3 is a circuit view showing the preferred embodiment of the present invention.

Please refer to FIGS. 2 and 3. The structures of respective elements in the motor driving circuit are described as follows.

Figure 4:
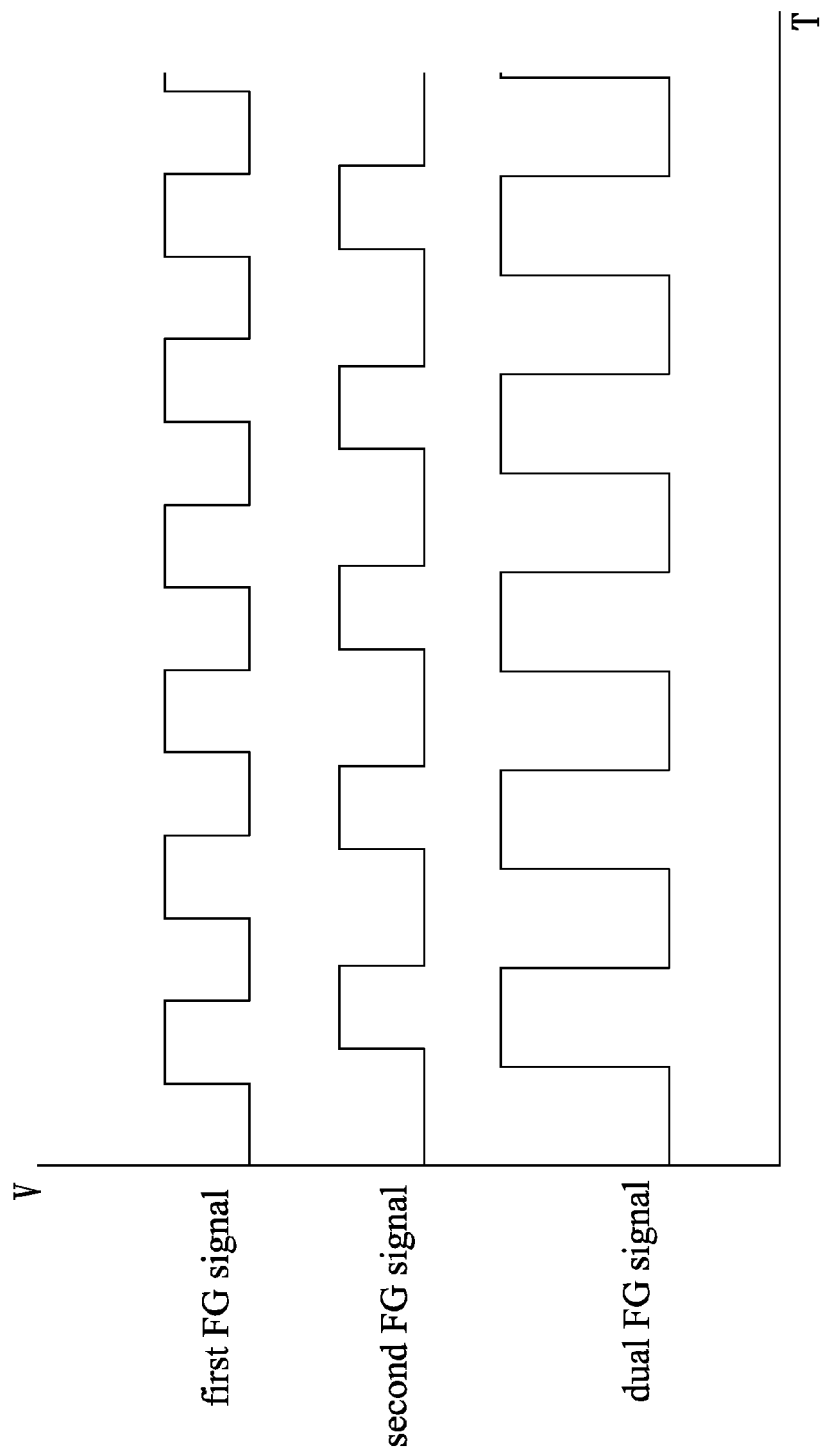
FIG. 4 is a waveform view showing the preferred embodiment of the present invention.

The control unit 1 comprises a control chip (IC) 10. The control chip 10 has a first pin, a second pin, a third pin, a fourth pin, a fifth pin, a sixth pin, a seventh pin, and an eighth pin. The first pin and the seventh pin are electrically connected to the motor 5. The fifth pin is coupled to a first terminal of a first resistor R1. A second terminal of the first resistor R1 is electrically connected to a reference voltage VCC. The first resistor R1 is a pull-up resistor capable of increasing output level and protecting against the interference of noise, so that the fifth pin of the control chip 10 can output a square wave signal (i.e. the first FG signal) of high level by means of the inherent property of the connected first resistor R1, as shown in FIG. 4.

The sixth pin of the control chip 10 is coupled to a first terminal of a capacitor C and the reference voltage VCC. A second terminal of the capacitor C and the eighth pin of the control chip 10 are coupled to a grounding terminal GND. The first Hall unit 2 has a first Hall sensor 20. The first Hall sensor 20 has a first pin, a second pin, a third pin and a fourth pin. The first pin and the second pin of the first Hall sensor 20 are coupled to the third pin and the second pin of the control chip 10 respectively. The third pin and the fourth pin of the first Hall sensor 20 are coupled to the grounding terminal GND and the fourth pin of the control chip 10 respectively.

The logic unit 4 comprises a XOR gate 40. The XOR gate 40 has a first pin, a second pin, a third pin, a fourth pin (i.e., the output terminal of the logic unit 4) and a fifth pin. The first pin is coupled to the first terminal of the first resistor R1. The second terminal of the first resistor R1 is electrically connected to the fifth pin and the reference voltage VCC. The third pin is coupled to the grounding terminal GND. The fourth pin is coupled to a first terminal of a second resistor R2. A second terminal of the second resistor R2 is electrically connected to the fifth pin.

The second resistor R2, like the first resistor R1, is a pull-up resistor capable of increasing output level and protecting against the interference of noise. With the inherent property of the second resistor R2 connected to the fourth pin of the XOR gate 40, a high-level dual FG signal can be outputted (as shown in FIG. 4).

Please refer to FIGS. 2 and 3 again. The second Hall unit 3 comprises a second Hall sensor 30. The second Hall sensor 30 serves as a latch and has a first pin, a second pin and a third pin. The first pin is coupled to the reference voltage VCC, a first terminal of a third resistor R3, and the second terminal of the first resistor R1. The third resistor R3 is also a pull-up resistor and has the same property and function as those of the first and second resistors R1 and R2. Therefore, the third pin of the second Hall sensor 30 outputs another high-level square wave signal (i.e., the second FG signal) by means of the inherent property of the third resistor R3 (as shown in FIG. 4).

The second pin of the second Hall sensor 30 is coupled to the grounding terminal GND. The third pin is electrically connected to the second terminal of the third resistor R3 and the second pin of the XOR gate 40.

Therefore, with the control unit 1, the first Hall unit 2, the second Hall unit 3, and the logic unit 4 being integrated in the motor driving circuit, the convenience in use can be improved greatly. Furthermore, the working hours and the production cost can be reduced.

According to the above, the present invention provides a motor driving circuit capable of outputting a dual FG signal, and it has advantages of improved convenience, reduced cost and working hours.

Although the present invention has been described with reference to the foregoing preferred embodiment, it will be understood that the invention is not limited to the details thereof. Various equivalent variations and modifications can still occur to those skilled in this art in view of the teachings of the present invention. Thus, all such variations and equivalent modifications are also embraced within the scope of the invention as defined in the appended claims.

What is claimed is:

1. A motor driving circuit capable of outputting a dual frequency generator (FG) signal, including:
   a control unit electrically connected to a first Hall unit, the control unit being configured to generate a first FG signal based on a Hall signal sent by the first Hall unit;
   a second Hall unit configured to detect a change in magnetic fields to generate a second FG signal; and
   a logic unit electrically connected to the control unit and the second Hall unit, the logic unit being configured to perform a logic operation to the first and second FG signals to thereby convert them into a dual FG signal; and
   wherein the logic unit comprises a XOR gate having a first pin, a second pin, a third pin, a fourth pin and a fifth pin, and wherein the first pin is coupled to a first terminal of a first resistor, a second terminal of the first resistor is coupled to the fifth pin and a reference voltage, the third pin is coupled to a grounding terminal, the fourth pin is coupled to a first terminal of a second resistor, a second terminal of the second resistor is coupled to the fifth pin.

2. The motor driving circuit capable of outputting a dual FG signal according to claim 1, wherein the second Hall unit comprises a second Hall sensor having a first pin, a second pin and a third pin, the first pin is coupled to the reference voltage, a first terminal of a third resistor and a second terminal of the first resistor, the second pin is coupled to the grounding terminal, the third pin is coupled to a second terminal of the third resistor and the second pin of the XOR gate.

3. The motor driving circuit capable of outputting a dual FG signal according to claim 1, wherein the control unit comprises a control chip having a first pin, a second pin, a third pin, a fourth pin, a fifth pin, a sixth pin, a seventh pin and an eighth pin, the first pin and the seventh pin are electrically connected to a motor, the fifth pin is coupled to the first terminal of the first resistor, the sixth pin is coupled to a first terminal of a capacitor and the reference voltage, a second terminal of the capacitor and the eighth pin are coupled to the grounding terminal.

4. The motor driving circuit capable of outputting a dual FG signal according to claim 3, wherein the first Hall unit comprises a first Hall sensor having a first pin, a second pin, a third pin and a fourth pin, the first pin and the second pin are coupled to the third pin and the second pin of the control chip respectively, the third pin and the fourth pin are coupled to the grounding terminal and the fourth pin of the control chip respectively.

* * * * *